United States Patent
Kobayashi

(10) Patent No.: US 6,822,598 B2
(45) Date of Patent: Nov. 23, 2004

(54) MULTI-STAGE PIPELINE TYPE ANALOG-TO-DIGITAL CONVERSION CIRCUIT FOR ADJUSTING INPUT SIGNALS

(75) Inventor: Shigeto Kobayashi, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/673,137

(22) Filed: Sep. 30, 2003

(65) Prior Publication Data

US 2004/0066320 A1 Apr. 8, 2004

(30) Foreign Application Priority Data

Oct. 3, 2002 (JP) .................................. 2002-291720

(51) Int. Cl.$^7$ ............................................... H03M 1/12
(52) U.S. Cl. ...................... 341/155; 341/172; 341/161
(58) Field of Search ................................ 341/155, 172, 341/161, 162

(56) References Cited

U.S. PATENT DOCUMENTS 6,211,806 B1 * 4/2001 McCarroll .................. 341/155
6,304,206 B1 * 10/2001 Wada et al. ................. 341/162
6,456,211 B2 * 9/2002 Wu et al. .................... 341/155
6,683,554 B2 * 1/2004 Nikai et al. ................. 341/155

FOREIGN PATENT DOCUMENTS

| JP | 09-069776 | 3/1997 |
| JP | 09-275342 | 10/1997 |

* cited by examiner

*Primary Examiner*—Don Le
*Assistant Examiner*—Lam T. Mai
(74) *Attorney, Agent, or Firm*—McDermott Will & Emery LLP

(57) ABSTRACT

In a first conversion unit in an analog-digital conversion circuit, a first analog-to-digital (A-D) conversion unit converts input voltage values to digital values, and a first digital-to-analog (D-A) conversion unit coverts the digital values again to analog values. A comparator determines a range of the input voltage, and a sample-and-hold circuit holds a value adjusted according to this result. The first D-A conversion unit makes a similar adjustment to the digital value. A difference between a value held at a first amplifier circuit and an output value of the first D-A conversion unit is amplified so as to be supplied to the next stage.

15 Claims, 15 Drawing Sheets

|        | CPout=0 | CPout=1 |
|--------|---------|---------|
| CDS201 | VDD     | VDD     |
| CDS202 | VDD     | VDD     |
| CDS203 | Z2      | Z10     |
| CDS204 | Z2      | Z10     |
| CDS205 | Z3      | Z11     |
| CDS206 | Z3      | Z11     |
| CDS207 | Z4      | Z12     |
| CDS208 | Z4      | Z12     |
| CDS209 | Z5      | Z13     |
| CDS210 | Z5      | Z13     |
| CDS211 | Z6      | Z14     |
| CDS212 | Z6      | Z14     |
| CDS213 | Z7      | Z15     |
| CDS214 | Z7      | Z15     |
| CDS215 | Z8      | Z16     |
| CDS216 | Z8      | Z16     |
| CDS221 | VSS     | VSS     |
| CDS222 | VSS     | VSS     |

MULTI-STAGE PIPELINE TYPE ANALOG-TO-DIGITAL CONVERSION CIRCUIT FOR ADJUSTING INPUT SIGNALS

BACKGROUND OF THE INVENTION

1. Field of the Invention

The present invention relates to analog-to-digital (A-D) converters, and it particularly relates to a technology by which to improve the performance of pipeline type A-D converters.

2. Description of the Related Art

In the conventional practice, the sample-and-hold circuits and amplifier circuits have been utilized to constitute the multi-stage pipeline type analog-to-digital converters (hereinafter referred to as "A-D converters") (see the following Related Art List for reference). The ranges of voltages that can be outputted are determined in advance according to the respective characteristics of circuits.

Related Art List (1) Japanese Patent Application Laid-Open No. Hei09-275342, pages 9–16, FIG. 1
(2) Japanese Patent Application Laid-Open No. Hei09-69776, pages 4–6, FIG. 1

The output voltage of the above-mentioned circuit is theoretically proportional to the input voltage thereof. However, beyond or outside an effective output range which is a characteristic to be determined by the circuit, the resulting output may not necessarily be proportional to the input thereof. Hence, depending on the input voltage value, there has always been a possibility that the conversion accuracy drops with an incorrect value conveyed to a next stage.

On the other hand, it has been an important design challenge to achieve a lower-voltage design for an A-D converter as a whole. Yet designing a circuit with a wider output range therefore goes counter to it. Besides, as equipment of lower-voltage design increase, there will be greater need for circuits with narrower output range.

SUMMARY OF THE INVENTION

The present invention has been made in view of the foregoing circumstances and an object thereof is to raise the conversion accuracy of an A-D converter.

A preferred embodiment according to the present invention relates to a signal conversion method. This method includes: determining the range of an input signal; setting a level of a reference signal according to the determining so that the input signal falls within a satisfactory range in terms of conversion performance thereof; holding a signal value obtained as a result of adjustment to the input signal using the reference signal; converting the input signal to a target signal in parallel with the holding; and offsetting temporary variation caused in the input signal held in the holding.

The determining may determine whether a voltage value of the input signal is positive or negative or whether the input signal falls within a predetermine range or not. The "conversion performance" may be capability or capacity such as accuracy and efficiency at the time the input signal is converted into a desired format. The "satisfactory range" is the range, for example, in which an ideal value or expected value is achieved in the input-output characteristics of elements constituting a conversion circuit. The "reference signal" is a signal set based on a reference voltage and, for example, the "reference signal" may be referred to by a circuit in which a value of the input signal is acquired and held temporarily when the above conversion is processed.

The reference signal is set to different values according to the range of the input signal. When the reference signal is set to a value other than 0V, the value held by the circuit is temporarily varied and does not indicate a proper value. On the other hand, the value held by the circuit belongs to a range that keeps the conversion performance satisfactory. The temporary variation is cancelled out or offset by making another adjustment during the conversion processing. By implementing the above method, the input signal can be converted into a target signal while the conversion performance is kept in a desirable state. Since the voltage value of the input signal does not exceed or become outside a predetermined range, the conversion under low voltage is possible, thus reducing the power consumption.

Another preferred embodiment according to the present invention relates to a signal conversion circuit. This circuit includes: a first adjustment unit which sets a level of a reference signal according to a range of an input signal so that values of the input signal fall within a satisfactory range in terms of conversion performance thereof; a second adjustment unit which offsets temporary variation which is caused in the input signal and by operation of the reference signal thereon, during converting the input signal into a target signal.

The first adjustment unit may include a sample-and-hold circuit which samples a signal based on a reference signal and holds this, or an amplifier circuit which amplifies a signal based on the reference signal. The outputs of these circuits may vary, due to the level-adjusted reference signal operated thereon, in a manner such that the outputs thereof fall within a fixed range. Thereby, the output values are kept proportional to the input values. As methods of canceling out or offsetting the variation by the second adjustment unit, there is, for example, a method where the value held at the sample-and-hold circuit is modified and then adjusted.

By implementing the above circuit, the input signal can be converted into a target signal while the conversion performance is kept in a desirable state. Since the voltage value of the input signal does not exceed or become outside a fixed range, the conversion under low voltage is possible, thus reducing the power consumption.

Still another preferred embodiment according to the present invention relates to an analog-to-digital conversion circuit. This circuit includes: a first adjustment unit which sets a level of a reference signal according to a range of an input analog voltage so that values of the input analog voltage fall within a satisfactory range in terms of conversion performance thereof; an analog-to-digital (A-D) conversion unit which converts the values of the input analog voltage into digital values; and a second adjustment unit which offsets temporary variation which is caused in the values of the input analog voltage and as a result of the reference signal operated thereon during A-D conversion.

The A-D conversion unit is comprised of a plurality of comparators, encoders and so forth so as to convert input analog voltage values into digital values represented by a predetermined bit number. Thus, this A-D conversion unit can be interpreted or thought of as an analog-to-digital (A-D) converter in a narrow sense. There may be provided a plural stages of such A-D converter units so as to realize a pipeline structure which generates one or more bit digital value(s), based on the input analog voltage, gradually from a high-order bit at each of the stages thereof. In such a case, the allocation as to how many bits are to be generated for each stage can be arbitrarily set based on a design concept. The first adjustment unit and the second adjustment unit may be provided at any of the stages.

The first adjustment unit may include at lease one comparator which determines the range of the input analog voltage and a sample-and-hold unit which holds a value obtained in a manner such that temporary variation is added to the value of the input analog voltage based on the thus set reference signal so that the values of the input analog voltage fall within the satisfactory range. The second adjustment unit may include: a digital-to-analog (D-A) conversion unit which converts the digital value into an analog value and makes an adjustment to offset the temporary variation thereof; and a differential amplifier circuit which subtracts the thus converted analog value from the analog voltage value held at the sample-and-hold unit and amplifies the thus obtained signal.

If there is unintentional error in the value held by the sample-and-hold circuit, the overall accuracy of the A-D conversion will deteriorate. Thus, artificial variation is, inadvance, added to the input voltage which may cause the error to the output of the sample-and-hold circuit, on the condition that the added artificial variation is offset at a later stage. As a result thereof, the overall error is reduced. Variation same as the added variation is reflected on the output value of the D-A conversion circuit so as to be offset.

By implementing the above circuit, the A-D conversion performance is kept desirable and it is possible to perform the conversion at lower voltage, thus further reducing the power consumption. Moreover, circuits used for the adjustment can be realized by an internal design including a sample-and-hold circuit and a D-A conversion circuit, so that the overall necessary structure can be minimized.

Still another preferred embodiment according to the present invention relates also to an analog-to-digital conversion circuit. This circuit is a signal conversion circuit for converting analog signals into digital signals, and the circuit includes: analog-to-digital (A-D) conversion unit which acquires an input analog voltage value and then converts the acquired input analog voltage value into a digital value of a predetermined bit number; and a sample-and-hold unit which acquires and holds a value adjusted so that input analog voltage to be acquired by the A-D conversion unit falls within a satisfactory range in terms of conversion performance thereof.

This circuit according to this preferred embodiment shares the common points with other preferred embodiments in that the adjustment is made in such a manner as to ideally keep the input-output relation of the sample-and-hold circuit. On the other hand, the point especially characteristic to this embodiment and different from the other embodiments is that the values to be converted by the A-D conversion unit differ from those to be held by the sample-and-hold circuit. Namely, the input analog value is inputted, intact, to the A-D conversion unit and an adjusted value of the input analog value is inputted to the sample-and-hold unit. Thus, the A-D conversion unit converts analog values which are available before the sample-and-hold unit holds. Moreover, when the digital output of the A-D conversion unit is converted again into analog values, the similar adjustment to the sample-and-hold unit is made thereto, so that overall conversion accuracy is kept at the desired level.

The value to be inputted to the sample-and-hold unit may be a value obtained by again converting the output from the A-D conversion unit into an analog value and subtracting the thus converted analog value from the original analog value.

In such a case, the voltage value becomes small to a certain degree before being inputted to the sample-and-hold unit, so that the conversion performance is likely to fall within a desired range. By implementing these structures, the A-D conversion performance is kept desirable and it is possible to perform the conversion at lower voltage, thus further reducing the power consumption.

It is to be noted that any arbitrary combination of the above-described structural components and expressions changed between a method, an apparatus, a system and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

FIG. 11 shows a relationship between judgment signals CPout and values of adjustment signal CDS to be generated by a second adjustment circuit.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

First Embodiment

Figure 1:
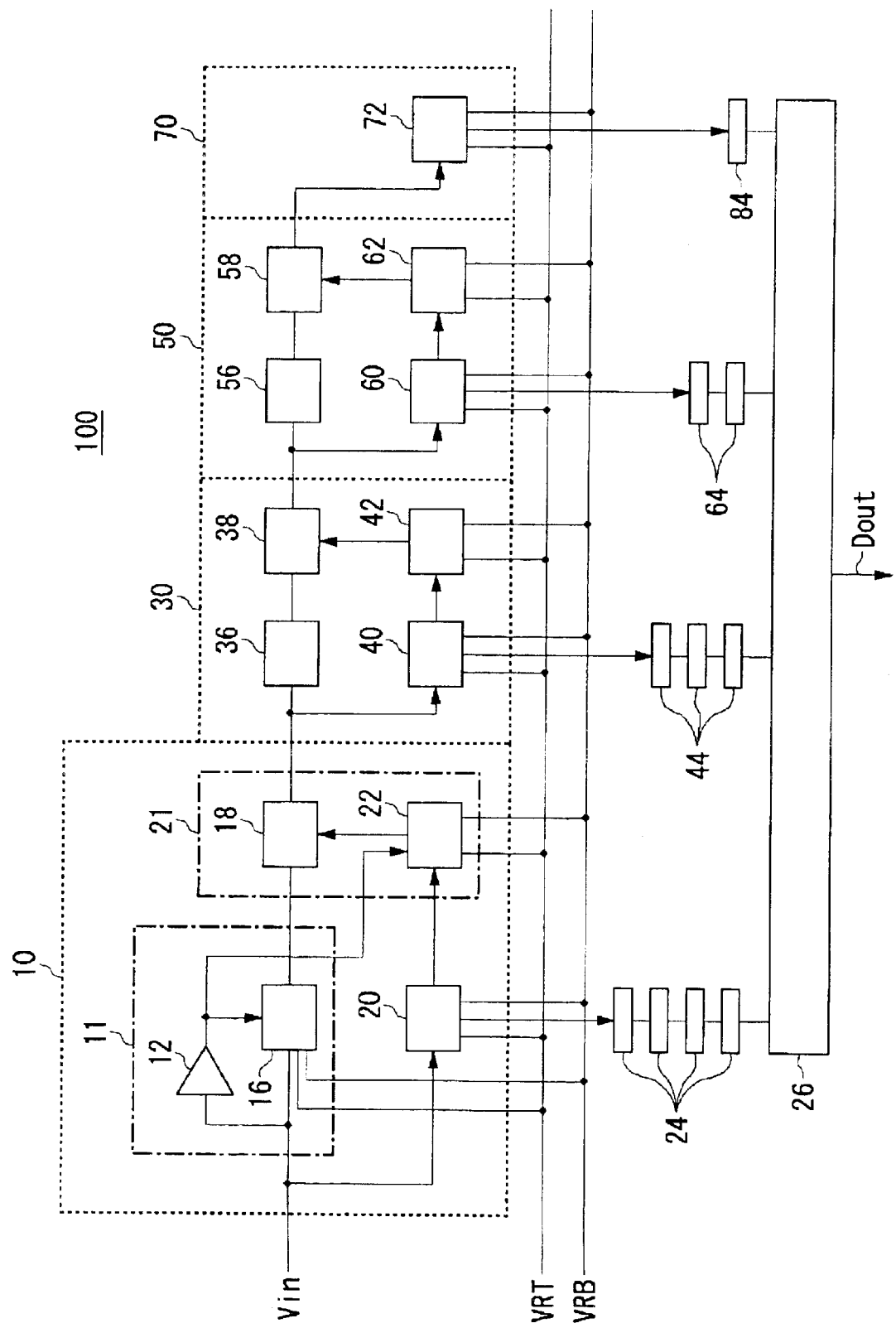
FIG. 1 shows a structure of an analog-digital conversion circuit according to a first embodiment of the present invention.

FIG. 1 shows a structure of an analog-digital (A-D) conversion circuit according to a first embodiment of the present invention. An analog-digital (A-D) conversion circuit 100 is a pipeline type A-D conversion circuit which includes a first conversion unit 10, a second conversion unit 30, a third conversion unit 50 and a fourth conversion unit 70. This circuit processes a total of 10 bits of A-D conversion in the order of 4 bits, 2 bits, 2 bits and 2 bits at the four stages from the first conversion unit 10 to the fourth conversion unit 70, respectively.

In the first conversion unit 10, a first AD conversion unit 20 converts an input analog voltage Vin into a 4-bit digital value. The digital value is inputted to a digital output circuit 26 after being subjected to a delay of four clocks by a first latch circuit 24 of a 4-stage structure. The output of the first A-D conversion unit 20 is converted into an analog value again by a first D-A conversion unit 22 and then inputted to a first amplifier circuit 18.

The input analog voltage Vin is sampled by a sample-and-hold circuit 16 and held therein until the end of processing by the first A-D conversion unit 20 and the first D-A conversion unit 22. The first amplifier circuit 18 amplifies a difference obtained by subtracting the value outputted by the first D-A conversion unit 22 from the value held by the sample-and-hold circuit 16. The amplified value is then sent to the second conversion unit 30, which is the next stage. It is to be noted that according to the present embodiment, the sample-and-hold circuit 16 is set for an amplification factor of 2, and the first amplifier circuit 18 is set for an amplification factor of 1.

Figure 2:
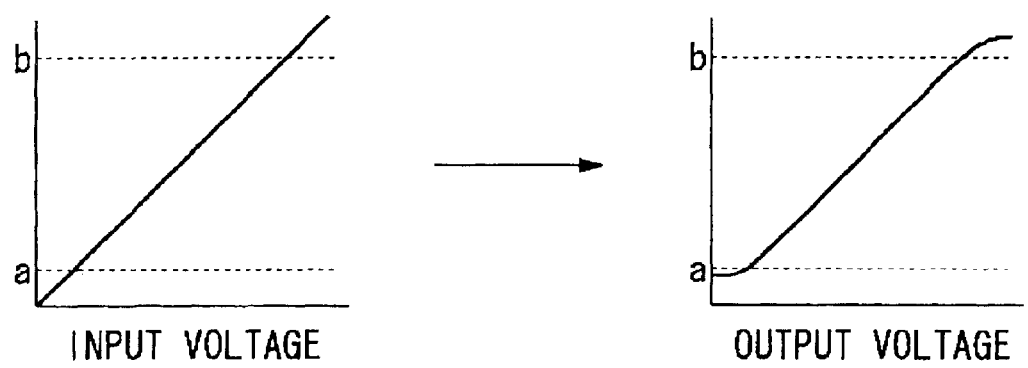
FIG. 2 shows a relationship between input voltage and output voltage of a sample-and-hold circuit.

Now, even in a structure where the output voltage value of a sample-and-hold circuit 16 is theoretically proportional to the input voltage value, the resulting output may not necessarily be proportional to the input thereto if a voltage outside a predetermined range is inputted. For example, as shown in FIG. 2, even with a sample-and-hold circuit whose amplification factor is theoretically 1, there may be cases where the output is not proportional to the input when a voltage outside the range of voltage values from a to b is inputted.

If an output not proportional to an input is conveyed to a second conversion unit 30, which is the next stage, then the conversion accuracy of the analog-to-digital conversion circuit 100 as a whole will drop. To adjust it, a first adjustment unit 11 as shown in FIG. 1 performs an advance adjustment so that an input analog voltage Vin falls within a predetermined range. Nonetheless the output of the sample-and-hold circuit 16 may show some variation in value, but the variation is offset by a second adjustment unit 21, which performs a similar adjustment to the value of the D-A conversion.

A comparator 12 decides whether an input analog voltage Vin is of a positive value or a negative value. The comparator 12 outputs "1" when the input analog voltage Vin is positive and outputs "0" when it is negative. This output is sent to the sample-and-hold circuit 16 and the first D-A conversion unit 22. Now, based on the above decision, the sample-and-hold circuit 16 makes an adjustment of the input analog voltage Vin. The first D-A conversion unit 22 adjusts the value to be converted the same way as the sample-and-hold circuit 16 does. Then the adjustments made by the sample-and-hold circuit 16 and the first D-A conversion unit 22 are offset by a differential amplification by a first amplifier circuit 18, so that the same voltage value as when the adjustments have not been made is obtained. In this manner, an A-D conversion is realized while the accuracy is maintained.

In the second conversion unit 30, the value amplified by the first amplifier 18 is converted by a second A-D conversion unit 40 into a 2-bit digital value. The digital value is inputted to a digital output circuit 26 after being subjected to a 3-clock delaying by a second latch circuit 44 of a 3-stage structure. The digital value outputted by the second A-D conversion unit 40 is converted into an analog value again by a second D-A conversion unit 42 and then inputted to a third amplifier circuit 38. The output from the first amplifier circuit 18 is further amplified by a second amplifier circuit 36. Then the third amplifier circuit 38 amplifies a difference obtained by subtracting the output from the second D-A conversion unit 42 from the output from the second amplifier circuit 36, and sends the thus amplified difference to the third conversion unit 50, which is the next stage.

In the third conversion unit 50, a third A-D conversion unit 60 converts the output of the third amplifier circuit 38 into a 2-bit digital value. The digital value is inputted to the digital output circuit 26 after being subjected to a 2-clock delaying by a third latch circuit 64 of a 2-stage structure. The output of the third A-D conversion unit 60 is converted into an analog value again by a third D-A conversion unit 62 and then inputted to a fifth amplifier circuit 58. A fourth amplifier circuit 56 further amplifies the output of the third amplifier circuit 38. Then the fifth amplifier circuit 58 amplifies a difference obtained by subtracting the output from the third D-A conversion unit 62 from the output from fourth amplifier circuit 56 and sends the thus amplified difference to the fourth conversion unit 70, which is the next stage.

In the fourth conversion unit 70, the output of the fifth amplifier circuit 58 is converted into a 2-bit digital value by a fourth A-D conversion unit 72. The digital value is inputted to the digital output circuit 26 after being subjected to a 1-clock delaying by a fourth latch circuit 84 of a 1-stage structure. The digital output circuit 26 receives the outputs of the first A-D conversion unit 20, the second A-D conversion unit 40, the third A-D conversion unit 60 and the fourth A-D conversion unit 72, synthesizes them into a 10-bit digital value Dout, and outputs the value. The outputs from the A-D conversion units at the different stages are synchronized by the delaying performed by the first latch circuit 24, the second latch circuit 44, the third latch circuit 64 and the fourth A-D conversion unit 72.

It is to be noted here that the sample-and-hold circuit 16, the first A-D conversion unit 20, the first D-A conversion unit 22, the second A-D conversion unit 40, the second D-A conversion unit 42, the third A-D conversion unit 60, the third D-A conversion unit 62 and the fourth A-D conversion unit 72 each refer to first and second reference voltages VRT and VRB.

Figure 3:
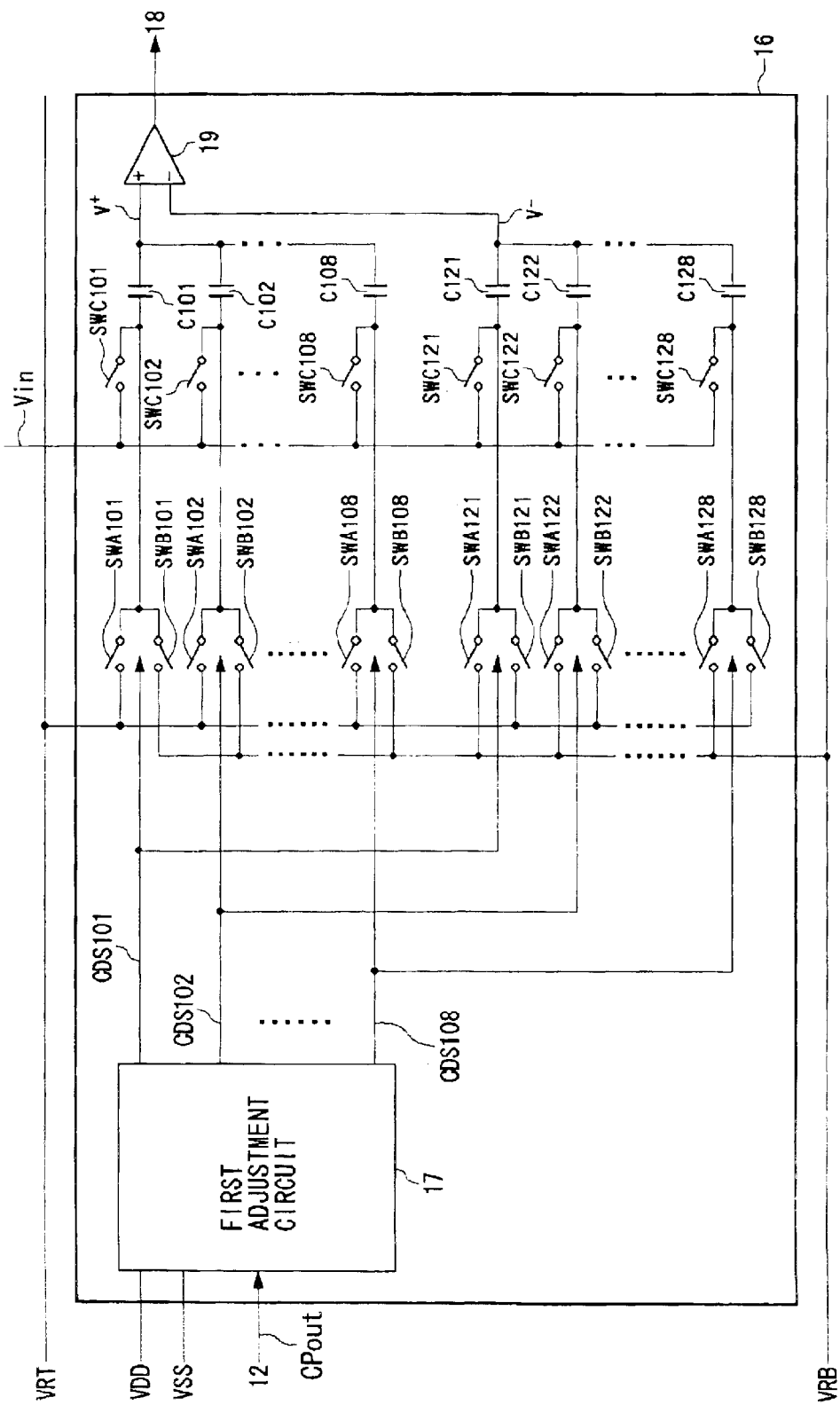
FIG. 3 shows a structure of a sample-and-hold circuit.

FIG. 3 shows a structure of a sample-and-hold circuit. A first adjustment circuit 17 generates signals for adjusting the voltage values to be received by the sample-and-hold circuit 16 in such a manner that they fall within a predetermined range. Output of first and second power supply lines VDD and VSS and judgment signals CPout outputted from the comparator 12 are inputted to the first adjustment circuit 17. Using these signals, the first adjustment circuit 17 generates and outputs first to eighth adjustment signals CDS101 to CDS108. First to eighth switches SWA101 to SWA108 turn on when the first to eighth adjustment signals CDS101 to CDS108 are high, respectively, and conduct the first reference voltage VRT. Ninth to sixteenth switches SWB101 to SWB108 turn on when the first to eighth adjustment signals CDS101 to CDS108 are low, respectively, and conduct the second reference voltage VRB. Depending on which of the first to eighth switches SWA101 to SWA108 and the ninth to sixteenth switches SWB101 to SWB108 turns on, the voltage to be referred to is switched between the first reference voltage VRT and the second reference voltage VRB. Electric charge corresponding to the voltage referred to is accumulated in first to eighth capacitors C101 to C108, respectively.

Seventeenth to twenty-fourth switches SWA121 to SWA128 turn on when the first to eighth adjustment signals CDS101 to CDS108 are high, respectively, and conduct the second reference voltage VRB. Twenty-fifth to thirty-second switches SWB121 to SWB128 turn on when the first to eighth adjustment signals CDS101 to CDS108 are low, respectively, and conduct the first reference voltage VRT. Depending on which of the seventeenth to twenty-fourth switches SWA121 to SWA128 and the twenty-fifth to thirty-second switches SWB121 to SWB128 turns on, the voltage to be referred to is switched between the second reference voltage VRB and the first reference voltage VRT. Electric charge corresponding to the voltage referred to is accumulated in ninth to sixteenth capacitors C121 to C128, respectively.

The first to eighth capacitors C101 to C108 and the ninth to sixteenth capacitors C121 to C128 are all of the same capacitance. The case where thirty-third to fortieth switches SWC101 to SWC108 and forty-first to forty-eighth switches SWC121 to SWC128 are all off will be considered here. According to the law of conservation of electric charge, the positive-side voltage $Vref^+$ inputted in a differential mode from the capacitance array of the first to eighth capacitors C101 to C108 to a first operational amplifier 19 is represented by the following equation (1):

$$Vref^+ = VRT - K(VRT - VRB)/8 \quad (1)$$

According to the law of conservation of electric charge, the negative-side voltage $Vref^-$ inputted in a differential mode from the capacitance array of the ninth to sixteenth capacitors C121 to C128 to a first operational amplifier 19 is represented by the following equation (2):

$$Vref^- = VRB + K(VRT - VRB)/8 \quad (2)$$

The positive-side voltage $Vref^+$ and the negative-side voltage $Vref^-$ are inputted in a differential mode to the first operational amplifier 19. The difference therebetween is represented by the following equation (3):

$$Vref^+ - Vref^- = (VRT - VRB) - K(VRT - VRB)/4 \quad (3)$$

where K is the number of low signals among the first to eighth adjustment signals CDS101 to CDS108. K switches out of the ninth to sixteenth switches SWB101 to SWB108 are turned on to conduct the second reference voltage VRB, whereas (8-K) switches out of the first to eighth switches SWA101 to SWA108 are turned on to conduct the first reference voltage VRT. Likewise, K switches out of the twenty-fifth to thirty-second switches SWB121 to SWB128 are turned on to conduct the first reference voltage VRT, whereas (8-K) switches out of the seventeenth to twenty-fourth switches SWA121 to SWA128 are turned on to conduct the second reference voltage VRB.

As the thirty-third to fortieth switches SWC101 to SWC108 and the forty-first to forty-eighth switches SWC121 to SWC128 are turned on, an input analog voltage Vin is applied to one end of the first to eighth capacitors C101 to C108 and the ninth to sixteenth capacitors C121 to C128, respectively. As a result, the positive-side voltage $V^+$ and the negative-side voltage $V^-$ are given by the following equations (4) and (5), respectively:

$$V^+ = Vin^+ - Vref^+ \quad (4)$$
$$= Vin^+ - (VRT - K(VRT - VRB)/8)$$

$$V^- = Vin^- - Vref^- \quad (5)$$
$$= Vin^- - (VRB + K(VRT - VRB)/8)$$

A voltage $\Delta V$ inputted in a differential mode to the first operational amplifier 19 is represented by the following equation (6):

$$\Delta V = V^+ - V^- \quad (6)$$
$$= Vin^+ - Vin^- - (Vref^+ - Vref^-)$$
$$= Vin^+ - Vin^- - ((VRT - VRB) - K(VRT - VRB)/4)$$

The first adjustment circuit 17 sets by an adjustment signal. a value of $(Vref^+ - Vref^-)$ which represents the value of a voltage referred to. Conventionally, $(Vref^+ - Vref^-) = 0$, but adjusting this fluctuates the output of the sample-and-hold circuit 16.

Figures 4, 5:
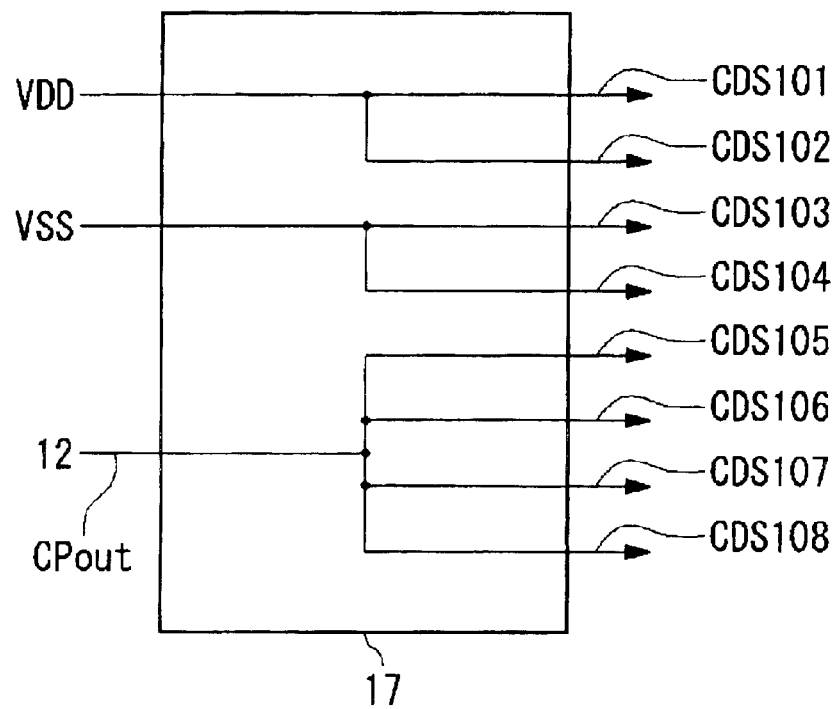
FIG. 4 shows a structure of a first adjustment circuit.
FIG. 5 shows a relationship between the values of input analog voltage and decisions by a comparator.

FIG. 4 shows a structure of a first adjustment circuit. The first adjustment circuit 17 generates and outputs first to eighth adjustment signals CDS101 to CDS108. The first and second adjustment signals CDS101 and CDS102, which are connected to a first power supply line VDD, are always high signals when outputted. The third and fourth adjustment signals CDS103 and CDS104, which are connected to a second power supply line VSS, are always low signals when outputted. As fifth to eighth adjustment signals CDS105 to CDS108, on the other hand, a judgment signal CPout outputted from the comparator 12 is outputted as it is.

FIG. 5 shows a relationship between the values of input analog voltage and decisions by a comparator. When the input analog voltage Vin is of a positive value, that is, larger than 0V, the judgment signal CPout made by the comparator 12 goes high. At this time, in the first adjustment circuit 17 of FIG. 4, six signals, namely, the first, second, fifth to eighth adjustment signals CDS101, CDS102, CDS105 to CDS108 go high while two signals, namely, the third and fourth adjustment signals CDS103 and CDS104 go low. Accordingly, K=2 and $V^+ - V^- = (VRT - VRB)/2$. In other words, the value of an input analog voltage Vin minus (VRT-VRB)/2 is held in the sample-and-hold circuit 16 and is then amplified twofold by the first operational amplifier 19.

On the other hand, when the input analog voltage Vin is of a negative value, that is, smaller than 0V, the judgment signal CPout made by the comparator 12 goes low. At this time, in the first adjustment circuit 17 of FIG. 4, two signals, namely, the first and second adjustment signals CDS101 and CDS102 go high while six signals, namely, the third to eighth adjustment signals CDS103 to CDS108 go low. Accordingly, K=6 and $V^+ - V^- = (VRT - VRB)/2$. In other words, the value of an input analog voltage Vin minus (VRB-VRT)/2 is held in the sample-and-hold circuit 16 and is then amplified twofold by the first operational amplifier 19.

Figure 6:
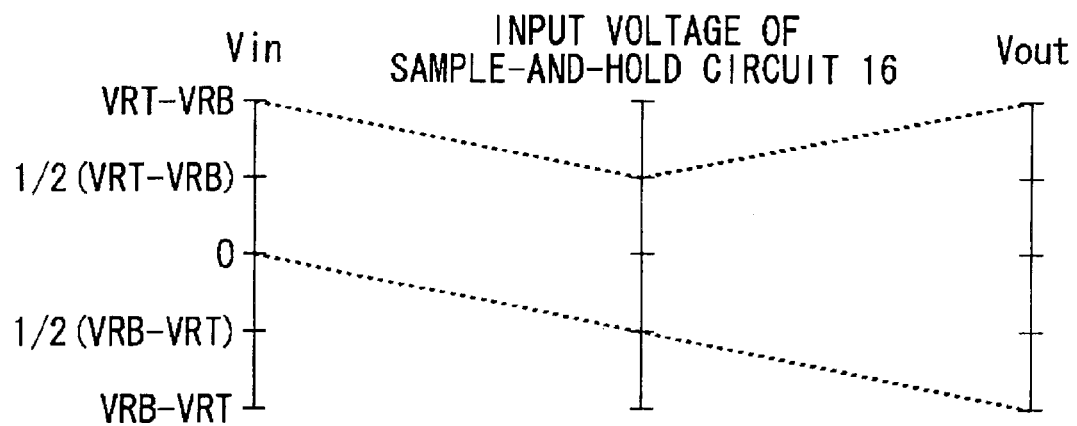
FIG. 6 shows a relationship of input and output voltages of a sample-and-hold circuit when an input analog voltage is of a positive value.

FIG. 6 shows a relationship of input and output voltages of a sample-and-hold circuit when the input analog voltage is of a positive value. A sample-and-hold circuit 16 according to the present embodiment subtracts (VRT-VRB)/2 from the value of an input analog voltage Vin, when it is larger than 0V, and at the same time amplifies this difference twofold. The left-hand axis in FIG. 6 represents the range of analog voltage that can be inputted to an analog-digital conversion circuit 100. The middle axis represents the range of voltage that can be inputted to the sample-and-hold circuit 16. The right-hand axis represents the range of voltage that can be outputted from the sample-and-hold circuit 16.

For example, the maximum value of input analog voltage Vin is the difference between the first reference voltage VRT and the second reference voltage VRB, but input values between (VRT–VRB)/2 and (VRT–VRB), if simply amplified twofold, go beyond the possible range of output by the sample-and-hold circuit 16 according to the present embodiment. Hence, (VRT–VRB)/2 is subtracted from the input analog voltage Vin to make certain that the input value falls within the range from (VRT–VRB)/2 to (VRB–VRT)/2. The values within the range from (VRT–VRB)/2 to (VRB–VRT)/2, when amplified twofold, do not go beyond the possible range of voltage output by the sample-and-hold circuit 16.

Figure 7:
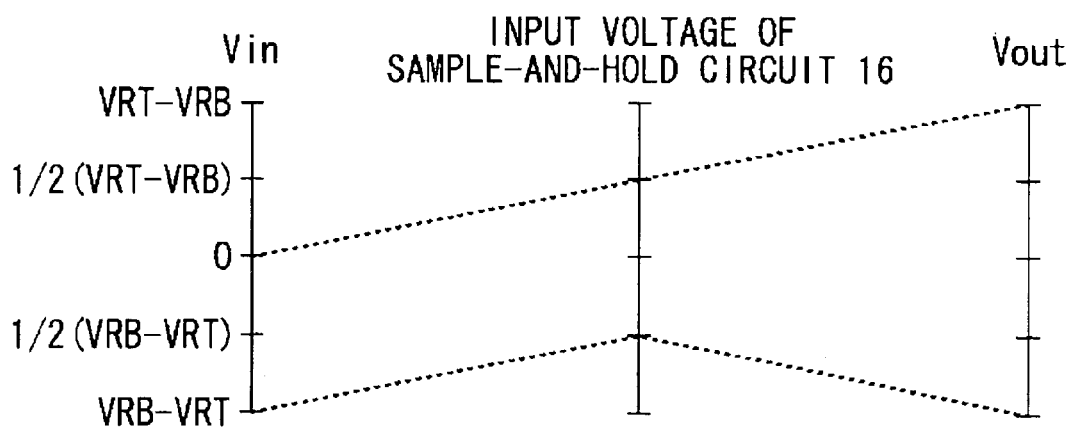
FIG. 7 shows a relationship of input and output voltages of a sample-and-hold circuit when an input analog voltage is of a negative value.

FIG. 7 shows a relationship of input and output voltages of a sample-and-hold circuit when the input analog voltage is of a negative value. The sample-and-hold circuit 16 subtracts (VRB–VRT)/2 from the value of an input analog voltage Vin, when the input analog voltage Vin is smaller than 0V, and at the same time amplifies the difference twofold. The minimum value of input analog voltage Vin is the difference between the second reference voltage VRB and the first reference voltage VRT, but input values between (VRB–VRT)/2 and (VRB–VRT), if simply amplified twofold, go beyond the possible range of output by the sample-and-hold circuit 16 according to the present embodiment. Hence, (VRB–VRT)/2 is subtracted from the input analog voltage Vin to make certain that the input value falls within the range from (VRB–VRT)/2 to (VRT–VRB)/2. The values within the range from (VRB–VRT)/2 to (VRT–VRB)/2, when amplified twofold, do not go beyond the possible range of voltage output by the sample-and-hold circuit 16.

Figure 8:
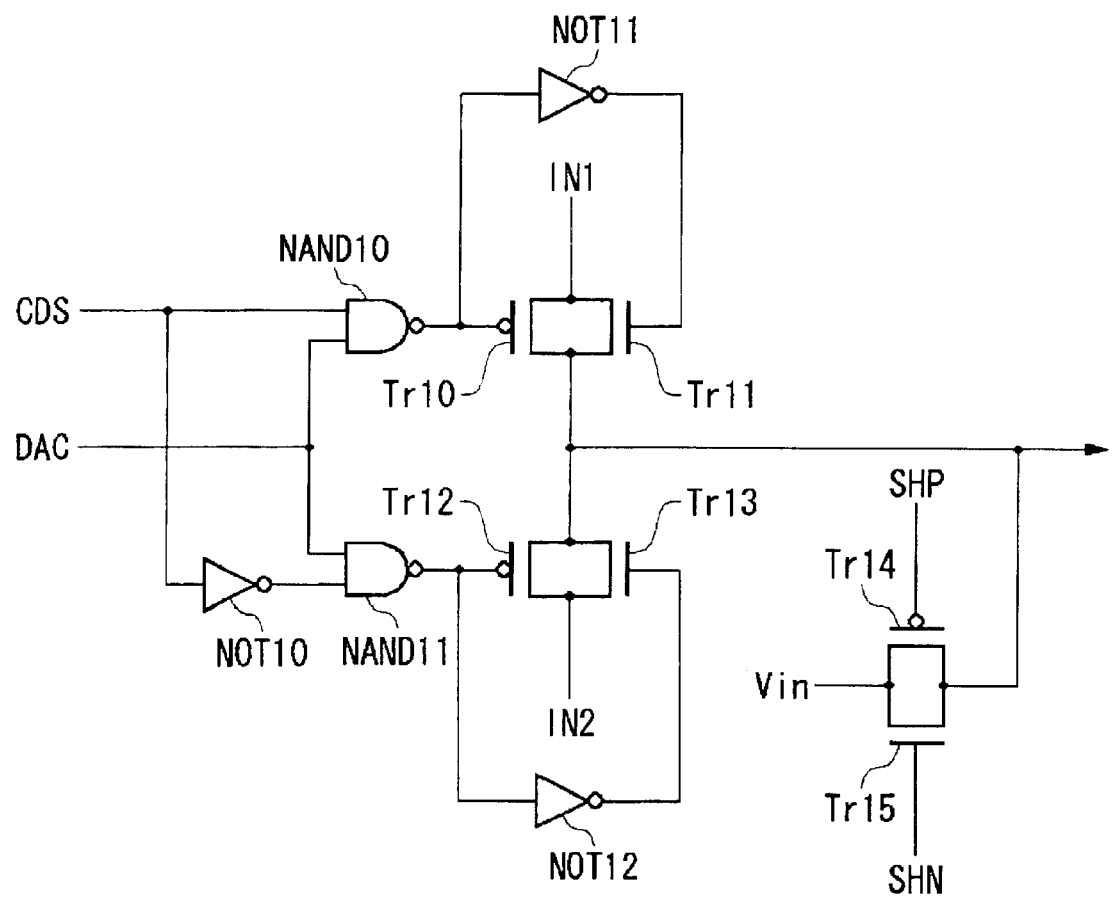
FIG. 8 shows a structure of switches and so forth included in a sample-and-hold circuit.

FIG. 8 shows a structure of switches and the like included in a sample-and-hold circuit. An adjustment signal CDS is not only inputted to a first NOT-AND circuit NAND10 but also inputted to a second NOT-AND circuit NAND11 after being inverted by a first NOT circuit NOT10. A first timing signal DAC is inputted to the first and second NOT-AND circuits NAND10 and NAND11.

Where the first and second transistors Tr10 and Tr11 are the first to eighth switches SWA101 to SWA108 of FIG. 3, the first reference voltage VRT is connected as a first input IN1. Where the third and fourth transistors Tr12 and Tr13 are the ninth to sixteenth switches SWB101 to SWB108 of FIG. 3, the second reference voltage VRB is connected as a second input IN2.

Where the first and second transistors Tr10 and Tr11 are the seventeenth to twenty-fourth switches SWA121 to SWA128 of FIG. 3, the second reference voltage VRB is connected as a first input IN1. Where the third and fourth transistors Tr12 and Tr13 are the twenty-fifth to thirty-second switches SWB121 to SWB128 of FIG. 3, the first reference voltage VRT is connected as a second input IN2.

When the adjustment signal CDS and a timing signal DAC are both driven high, the first NOT-AND circuit NAND10 outputs a low signal, which turns on the first transistor Tr10 and also the second transistor Tr11 via a second NOT circuit NOT11, thus supplying the first reference voltage VRT as a first input IN1.

When the adjustment signal CDS goes low and a first timing signal DAC goes high, the second NOT-AND circuit NAND11 outputs a low signal, which turns on the third transistor Tr12 and also the fourth transistor Tr13 via a third NOT circuit NOT12, thus supplying the second reference voltage VRB as a second input IN2.

The fifth and sixth transistors Tr14 and Tr15 are the thirty-third to fortieth switches SWC101 to SWC108 and the forty-first to forty-eighth switches SWC121 to SWC128 of FIG. 3, respectively. When a second timing signal SHP goes low and a third timing signal SHN goes high, fifth and sixth transistors Tr14 and Tr15 turn on to supply an input analog voltage Vin. In this manner, depending on the values of the adjustment signal CDS and the first to third timing signals DAC, SHP and SHN, the output is determined with one of the first and second reference voltages VRT and VRB and the input analog voltage Vin being supplied. These circuits are grouped as one set, and eight sets of circuits on each of the + side and – side are included in the sample-and-hold circuit 16.

Figure 9:
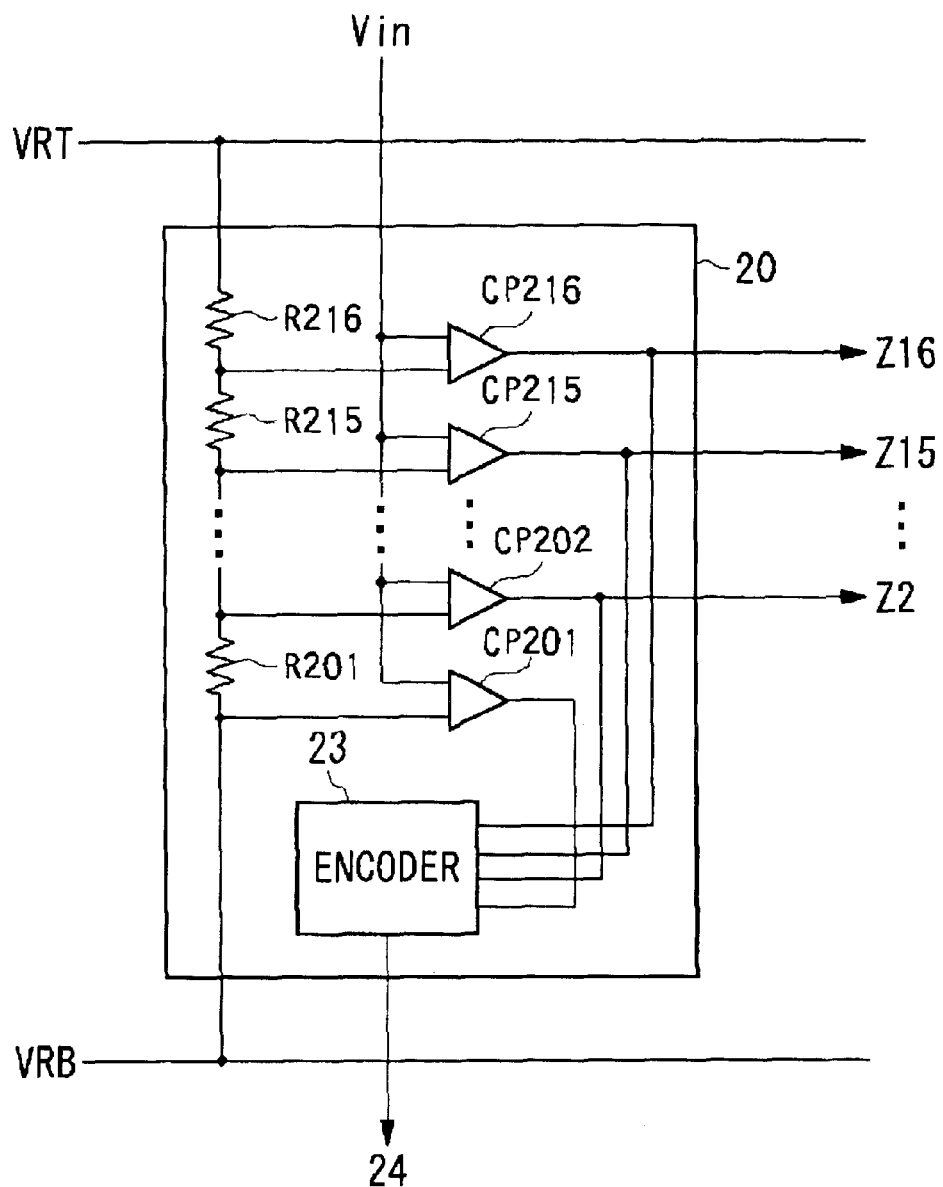
FIG. 9 shows a structure of a first A-D conversion unit.

FIG. 9 shows a structure of a first A-D conversion unit. In the first AD conversion unit 20, a first reference voltage VRT and a second reference voltage VRB are divided by first to sixteenth resistors R201 to R216. The divided voltages are compared to the input analog voltage Vin by first to sixteenth comparators CP201 to CP216, respectively. As a result of the comparison, a high signal is outputted when the voltage is smaller than the input analog voltage Vin, and a low signal is outputted when it is larger than the input analog voltage Vin. The outputs of the first to sixteenth comparators CP201 to CP216 are inputted to an encoder 23 and turned into 4-bit digital values so as to be sent to a first latch circuit 24. The outputs of second to sixteenth comparators CP202 to CP216 are sent to a first DA conversion unit 22 as second to sixteenth AD signals Z2 to Z16.

Figure 10:
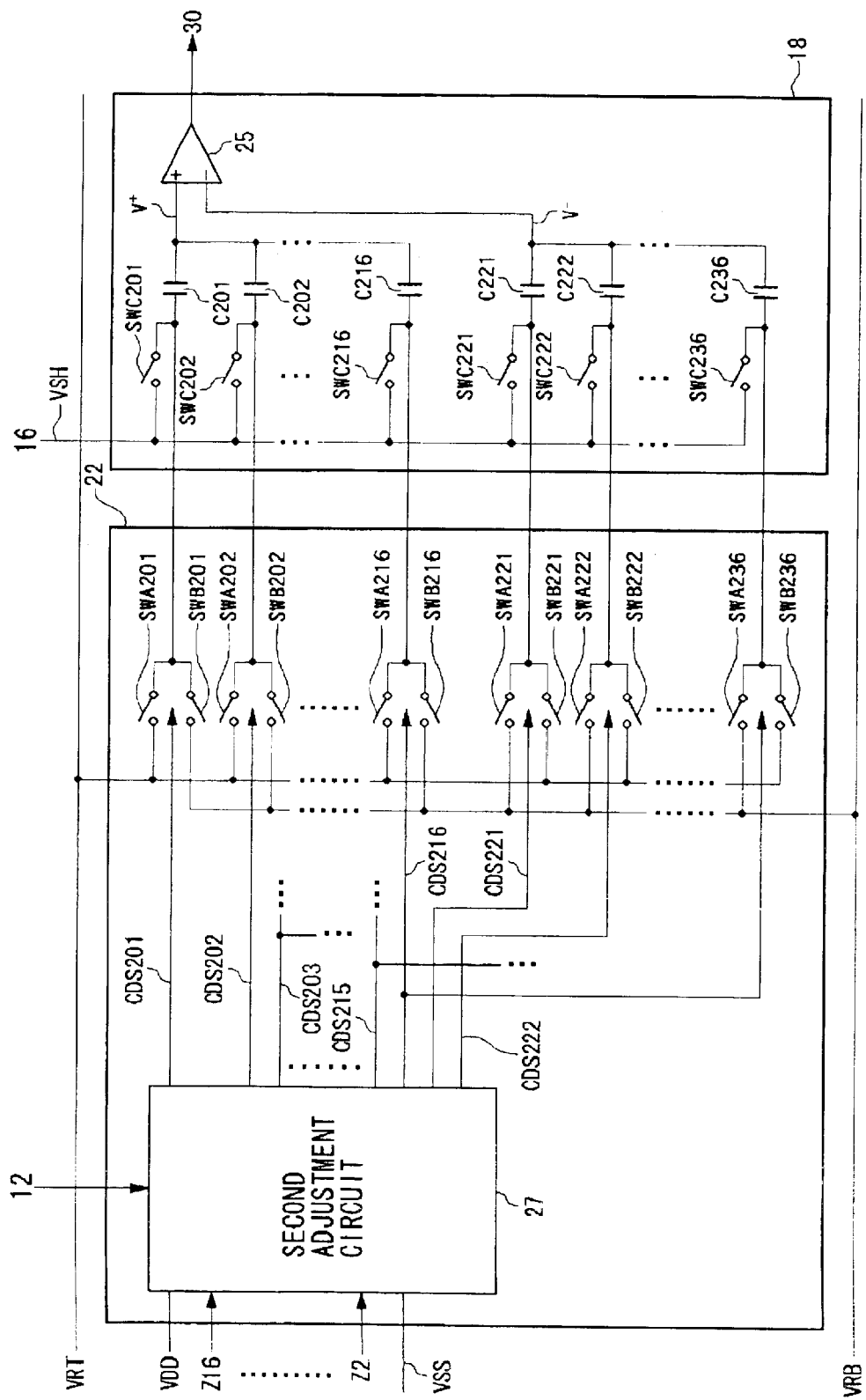
FIG. 10 shows a structure of a first D-A conversion unit and a first amplifier circuit.

FIG. 10 shows a structure of a first D-A conversion unit and a first amplifier circuit. In the first D-A conversion unit 22, a second adjustment circuit 27 receives the input of a judgment signal CPout from a comparator 12, first and second power supply lines VDD and VSS, and second to sixteenth AD signals Z2 to Z16 and, based on them, generates and outputs ninth to twenty-sixth adjustment signals CDS201 to CDS216, CDS221 and CDS222.

Forty-ninth to sixty-fourth switches SWA201 to SWA216 are turned on when ninth to twenty-fourth adjustment signals CDS201 to CDS216 are high, respectively, and conduct a first reference voltage VRT. Sixty-fifth to eightieth switches SWB201 to SWB216 are turned on when the ninth to twenty-fourth adjustment signals CDS201 to CDS216 are low, respectively, and conduct a second reference voltage VRB. Depending on which of the forty-ninth to sixty-fourth switches SWA201 to SWA216 and the sixty-fifth to eightieth switches SWB201 to SWB216 turn on, the voltage to be referred to is switched between the first reference voltage VRT and the second reference voltage VRB.

Eighty-first to ninety-sixth switches SWA221 to SWA236 are turned on when eleventh to twenty-sixth adjustment signals CDS203 to CDS216, CDS221 and CDS222 are high, respectively, and thus supply a second reference voltage VRB. Ninety-seventh to one hundred twelfth switches SWB221 to SWB236 are turned on when eleventh to twenty-sixth adjustment signals CDS203 to CDS216, CDS221 and CDS221 are low, respectively, and thus supply a first reference voltage VRT. Depending on which of the eighty-first to ninety-sixth switches SWA221 to SWA236 and the ninety-seventh to one hundred twelfth switches SWB221 to SWB236 turn on, the voltage to be referred to is switched between the second reference voltage VRB and the first reference voltage VRT.

Seventeenth to thirty-second capacitors C201 to C216 and thirty-third to forty-eighth capacitors C221 to C236 are all of the same capacitance. A case where one hundred thirteenth to one hundred twenty-eighth switches SWC201 to SWC216 and one hundred twenty-ninth to one hundred forty-fourth switches SWC221 to SWC236 are all off will be considered here. According to the law of conservation of electric charge, the positive-side voltage Vref⁺ inputted in a differential mode from the capacitance array of the seventeenth to thirty-second capacitors C201 to C216 to a second operational amplifier 25 is represented by the following equation (7):

$$Vref^+ = VRT - K^+(VRT-VRB)/16 \quad (7)$$

where K⁺ is the number of low signals among the ninth to twenty-fourth adjustment signals CDS201 to CDS216. K⁺ switches out of the sixty-fifth to eightieth switches SWB201 to SWB216 are turned on to conduct the second reference voltage VRB, whereas 16-K⁺ switches out of the forty-ninth to sixty-fourth switches SWA201 to SWA216 are turned on to supply the first reference voltage VRT.

According to the law of conservation of electric charge, the negative-side voltage Vref⁻ inputted in a differential mode from the capacitance array of the thirty-third to forty-eighth capacitors C221 to C236 to the second operational amplifier 25 is represented by the following equation (8):

$$Vref^- = VRB + K^-(VRT-VRB)/16 \quad (8)$$

The positive-side voltage Vref⁺ and the negative-side voltage Vref⁻ are inputted in a differential mode to the second operational amplifier 25. The difference therebetween is (Vref⁺−Vref⁻). Here K⁻ is the number of low signals among the eleventh to twenty-sixth adjustment signals CDS203 to CDS216, CDS221 and CDS222. K⁻ switches out of the ninety-seventh to one hundred twelfth switches SWB221 to SWB236 are turned on to supply the first reference voltage VRT, whereas (16-K⁻) switches out of the eighty-first to ninety-sixth switches SWA221 to SWA236 are turned on to supply the second reference voltage VRB.

As the one hundred thirteenth to one hundred twenty-eighth switches SWC201 to SWC216 and the one hundred twenty-ninth to one hundred forty-fourth switches SWC221 to SWC236 are turned on, an output voltage VSH from the sample-and-hold circuit 16 is applied to one end of the seventeenth to thirty-second capacitors C201 to C216 and the thirty-third to forty-eighth capacitors C221 to C236, respectively. As a result, the positive-side voltage V⁺ and the negative-side voltage V⁻ are given by the following equations (9) and (10), respectively:

$$V^+ = VSH^+ - Vref^+ \quad (9)$$
$$= VSH^+ - (VRT - K(VRT - VRB)/16)$$

$$V^- = VSH^- - Vref^- \quad (10)$$
$$= VSH^- - (VRB + K(VRT - VRB)/16)$$

A voltage ΔV inputted in a differential mode to the second operational amplifier 25 is represented by the following equation (11):

$$\Delta V = V^+ - V^- \quad (11)$$
$$= VSH^+ - VSH^- - (Vref^+ - Vref^-)$$

The second adjustment unit 21 sets by an adjustment signal a value of (Vref⁺−Vref⁻) which represents the value of a voltage referred to. Conventionally, (Vref⁺−Vref⁻)=0, but adjusting this fluctuates the output of the first DA conversion unit 22.

FIG. 11 shows a relationship between judgment signals CPout and the values of adjustment signal CDS to be generated by a second adjustment circuit. The ninth and tenth adjustment signals CDS201 and CDS202 are always of the same potential as the first power supply line VDD irrespective of the value of the judgment signal CPout made by the comparator 12. The twenty-fifth and twenty-sixth adjustment signals CDS221 and CDS222 are always of the same potential as the second power supply line VSS irrespective of the value of the judgment signal CPout made thereby.

Where the judgment signal CPout=0, the fourteen (14) signal outputs of the eleventh adjustment signal CDS203 to the twenty-fourth adjustment signal CDS216 are the second A-D signal Z2, the second A-D signal Z2, the third A-D signal Z3, the third A-D signal Z3, the fourth A-D signal Z4, the fourth A-D signal Z4, the fifth A-D signal Z5, the fifth A-D signal Z5, the sixth A-D signal Z6, the sixth A-D signal Z6, the seventh A-D signal Z7, the seventh A-D signal Z7, the eighth A-D signal Z8, and the eighth A-D signal Z8, respectively.

Where the judgment signal CPout=1, the fourteen (14) signal outputs of the eleventh adjustment signal CDS203 to the twenty-fourth adjustment signal CDS216 are the tenth AD signal Z10, the tenth AD signal Z10, the eleventh AD signal Z11, the eleventh AD signal Z11, the twelfth A-D signal Z12, the twelfth A-D signal Z12, the thirteenth A-D signal Z13, the thirteenth A-D signal Z13, the fourteenth A-D signal Z14, the fourteenth A-D signal Z14, the fifteenth AD signal Z15, the fifteenth AD signal Z15, the sixteenth AD signal Z16, and the sixteenth AD signal Z16, respectively.

Figure 12:
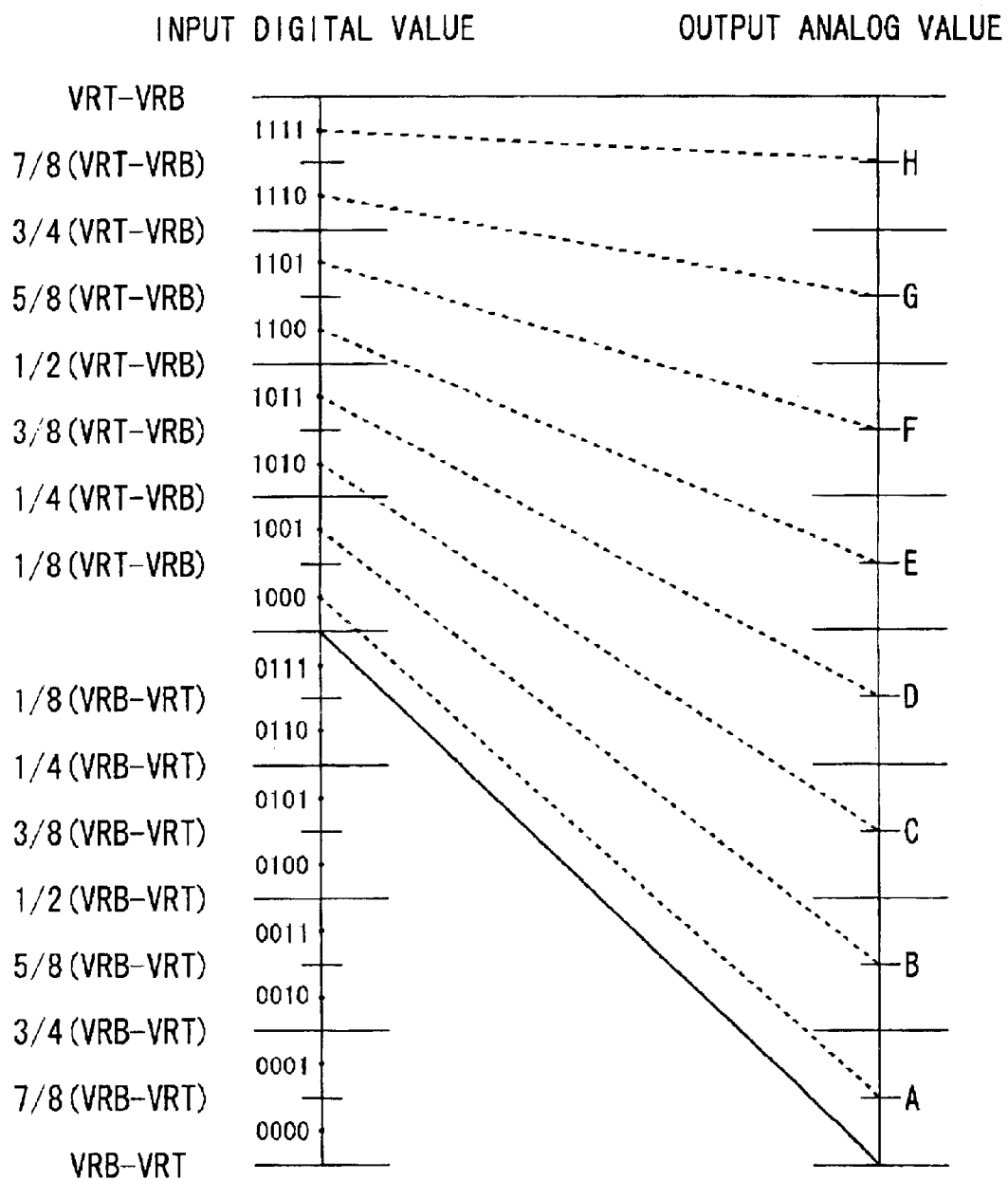
FIG. 12 shows a relationship between input voltages and output voltages at a first D-A conversion unit when an input analog voltage Vin is of a positive value.

FIG. 12 shows a relationship between input voltages and output voltages at a first D-A conversion unit when the input analog voltage Vin is of a positive value. The values inputted to the first D-A conversion unit 22 are digital values, and of the digital values indicated on the scale of the left-hand axis, the values from "1000" to "1111" are inputted. On the scale of the right-hand axis, the values after the DA conversion by the first D-A conversion unit 22 are A to H. Namely, the range of output analog values of the first D-A conversion unit 22 is equal to a twofold amplification of the range of input digital values. Moreover, the range thereof represents values so adjusted that they fit into a satisfactory output range at the first amplifier circuit 18.

For example, if the input digital value is "1011," the judgment signal CPout=1, the ninth to fourteenth adjustment signals CDS201 to CDS208 are high, and the fifteenth to twenty-sixth adjustment signals CDS209 to CDS216, CDS221 and CDS222 are low. Thus, K⁺=8, and K⁻=10. From the above equations (7) and (8), $$Vref^+ - Vref^- = (VRB - VRT)/8$$
$$= D$$

Figure 13:
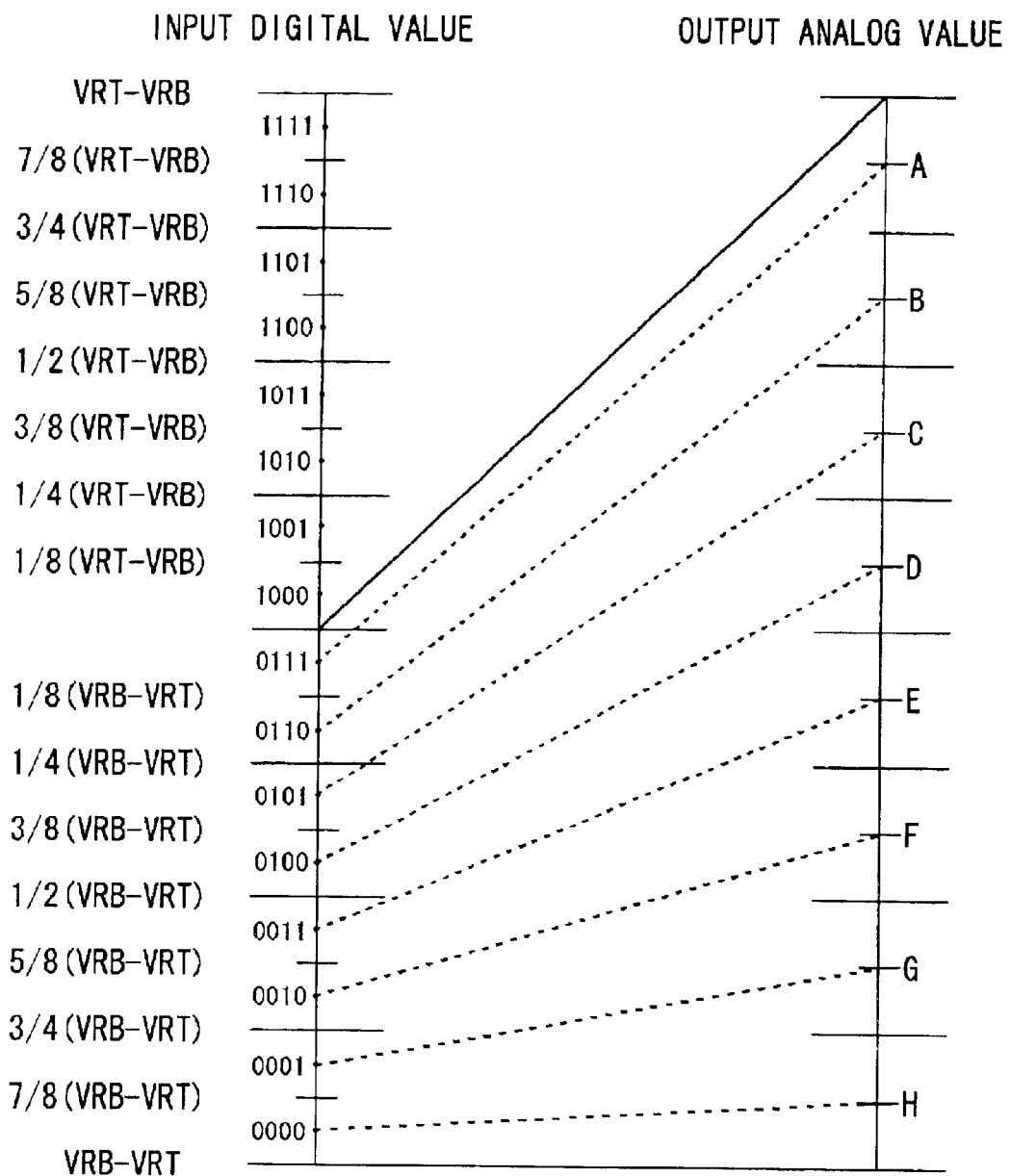
FIG. 13 shows a relationship between input voltages and output voltages at a first D-A conversion unit when an input analog voltage Vin is of a negative value.

FIG. 13 shows a relationship between input voltages and output voltages at a first D-A conversion unit when the input analog voltage Vin is of a negative value. Of the digital values indicated on the scale of the left-hand axis, the values from "0111" to "0000" are the digital values outputted by the first A-D conversion unit 20. On the scale of the right-hand axis, the values after the D-A conversion by the first D-A conversion unit 22 are A to H. Namely, the range of output analog values of the first D-A conversion unit 22 is equal to a twofold amplification of the range of input digital values. Moreover, the range thereof represents values so adjusted that they fit into a satisfactory output range at the first amplifier circuit 18.

For example, if the input digital value is "0011," the judgment signal CPout=0, the ninth to sixteenth adjustment signals CDS201 to CDS208 are high, and the seventeenth to twenty-sixth adjustment signals CDS209 to CDS216, CDS221 and CDS222 are low. Thus, $K^+=8$, and $K^-=10$. From the above equations (7) and (8), $$Vref^+ - Vref^- = (VRB - VRT)/8$$
$$= E$$

Figure 14:
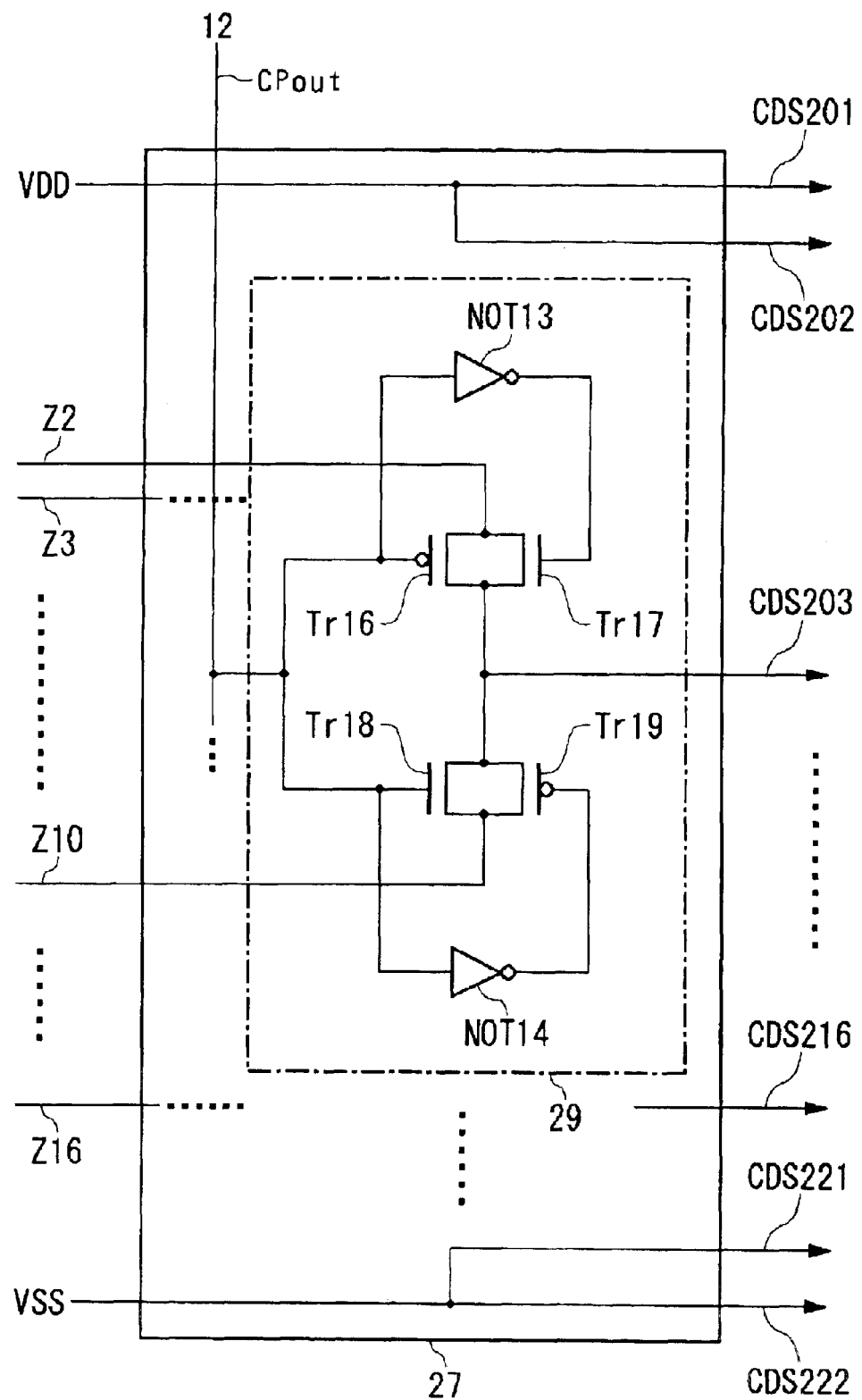
FIG. 14 shows a structure of a second adjustment circuit.

FIG. 14 shows a structure of a second adjustment circuit. In the second adjustment circuit 27, ninth and tenth adjustment signals CDS201 and CDS202 are connected to the first power supply line VDD and are kept high all the time. Twenty-fifth and twenty-sixth adjustment signals CDS221 and CDS222 are connected to the second power supply line VSS and are kept low all the time. Eleventh to twenty-fourth adjustment signals CDS203 to CDS216 are generated based on the judgment signal CPout and second to sixteenth A-D signals Z2 to Z16. FIG. 14 exemplifies a detailed circuit for generating an eleventh adjustment signal CDS203.

When the judgment signal CPout from the comparator 12 is high, ninth and tenth transistors Tr18 and Tr19 are turned on, and the tenth A-D signal Z10 is outputted as an eleventh adjustment signal CDS203. When the judgment signal CPout therefrom is low, seventh and eighth transistors Tr16 and Tr17 are turned on, and a second A-D signal Z2 is outputted as an eleventh adjustment signal CDS203. In this manner, either of the second A-D signal Z2 and the tenth A-D signal Z10 is selected, depending on the judgment signal CPout. There are provided the same number of a selection circuit 29, which is comprised of such elements as these seventh to tenth transistors Tr16 to Tr19 and fourth and fifth NOT circuits NOT13 and NOT14, as eleventh to twenty-fourth adjustment signals CDS203 to CDS216. The combinations of signals to be selected by the respective circuits are as shown in FIG. 11.

Second Embodiment

Figure 15:
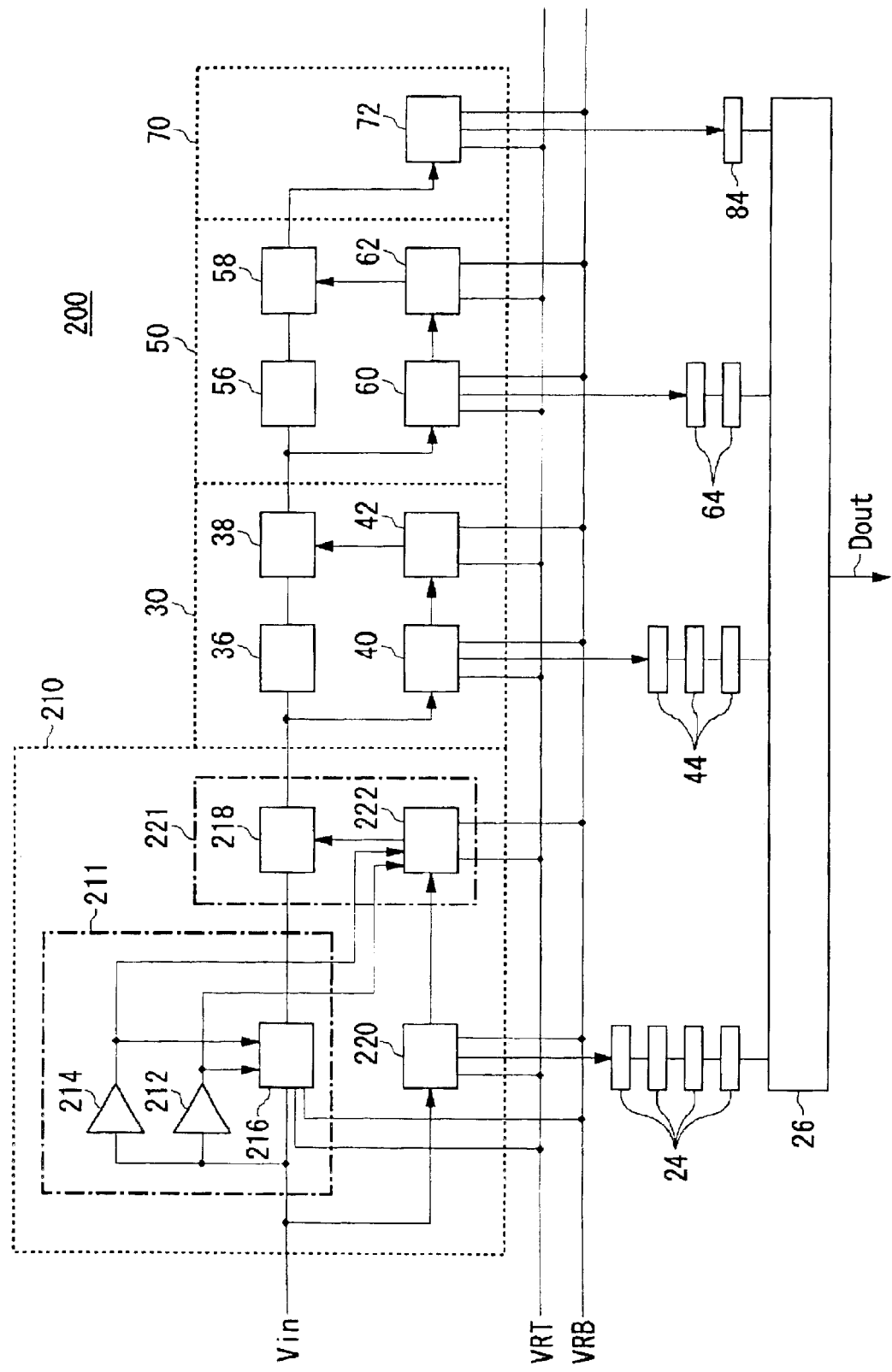
FIG. 15 shows a structure of an analog-digital conversion circuit according to a second embodiment of the present invention.

FIG. 15 shows a structure of an analog-digital conversion circuit according to a second embodiment of the present invention. An analog-digital conversion circuit 200 according to this second embodiment differs from the first embodiment in that two comparators are provided in order to decide whether an analog voltage inputted to a sample-and-hold circuit 216 is within a desirable range or not. The comparator 12 according to the first embodiment judges whether an input analog voltage Vin is of a positive value or a negative value, but according to this second embodiment, a first comparator 212 judges whether the input analog voltage Vin is lower than the lower limit of a desirable range and a second comparator 214 judges whether it is higher than the upper limit thereof. According to this second embodiment, the level adjustment of a reference signal is done only when necessary, whereas, according to the first embodiment, it is always done irrespective of the value of input analog voltage Vin.

In a first adjustment unit 211, the sample-and-hold circuit 216 adjusts the input analog voltage Vin in such a manner that it falls within a desirable range, according to the judgment made by the first comparator 212 and the second comparator 214. A first A-D conversion unit 220 converts the input analog voltage Vin into a digital value and sends it to a first latch circuit 24. The digital value is adjusted by a second adjustment unit 221 the same way as by the first adjustment unit 211. A first D-A conversion unit 222 converts the digital value into an analog value again and sends it to a first amplifier circuit 218. The first amplifier circuit 218 amplifies the difference between the value held by the sample-and-hold circuit 216 and the output of the first D-A conversion unit 222. At this time, the adjustment by the first adjustment unit 211 is offset by the adjustment by the second adjustment unit 221.

In this embodiment, too, A-D conversion can be executed in a pipeline manner while maintaining high accuracy. Moreover, A-D conversion can be realized at lower voltage, and power consumption reduced, because the first comparator 212 and the second comparator 214 make decisions so that the input analog voltage do not go beyond the upper and lower limits of a range for desirable conversion performance. While there is one more comparator than the first embodiment, a structure with a minimal number of elements assures accuracy.

Third Embodiment

Figure 16:
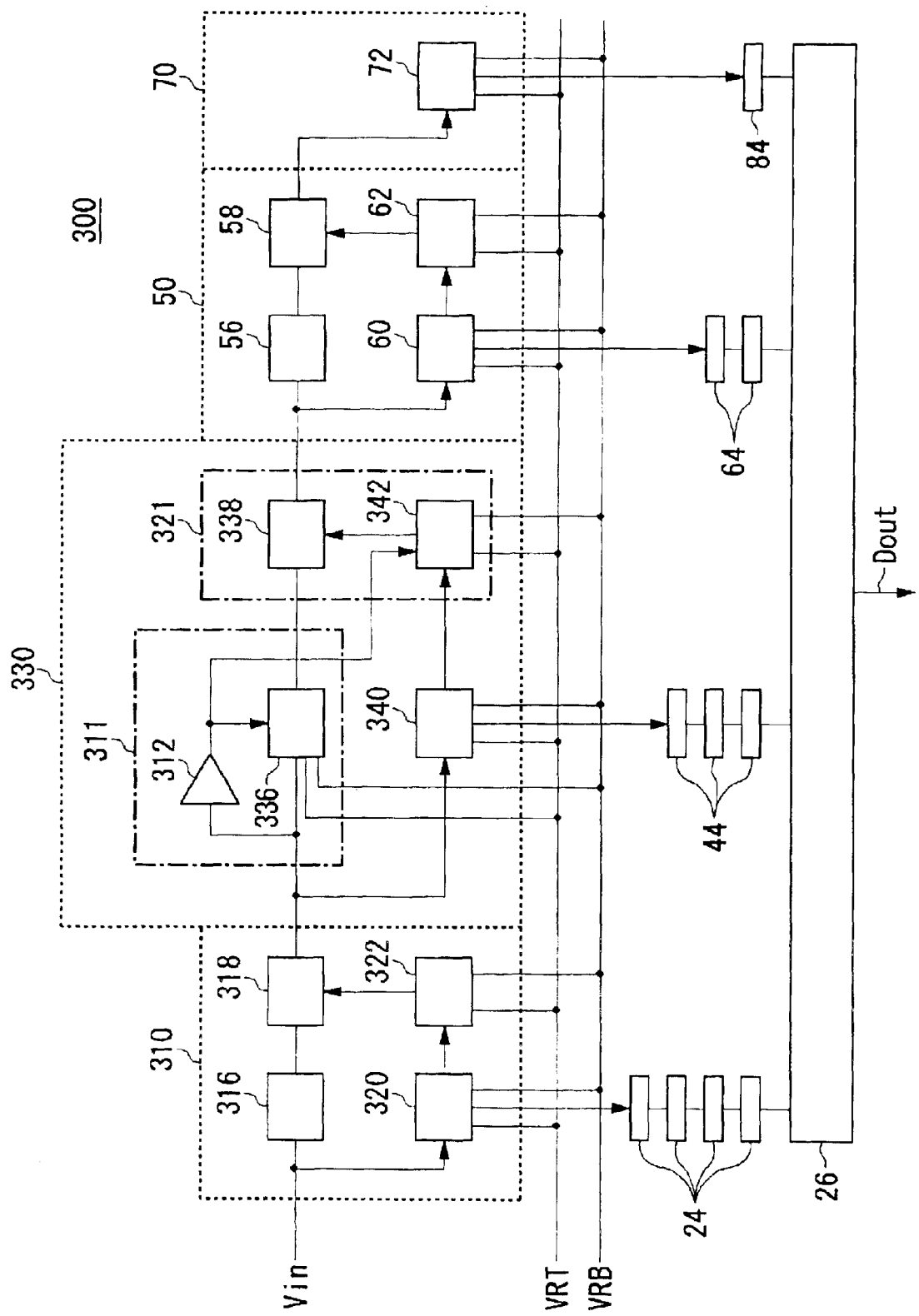
FIG. 16 shows a structure of an analog-digital conversion circuit according to a third embodiment of the present invention.

FIG. 16 shows a structure of an analog-digital conversion circuit according to a third embodiment of the present invention. The analog-digital conversion circuit 300 according to this third embodiment differs from the first and second embodiments in that adjustment and offsetting of voltage values are done in a second conversion unit 330. In a first conversion unit 310, a first A-D conversion unit 320 converts the input analog voltage Vin into a digital value and sends it to a first latch circuit 24, and the digital value is converted into an analog value again by a first D-A conversion unit 322. A first amplifier circuit 316 amplifies the input analog voltage Vin, and a second amplifier circuit 318 amplifies the difference between the output of the first amplifier circuit 316 and the output of the first D-A conversion unit 322.

In the second conversion unit 330, a second AD conversion unit 340 converts the output of the second amplifier circuit 318 into a digital value and sends it to a second latch circuit 44. The digital value is converted into an analog value again by a second D-A conversion unit 342. A first adjustment unit 311 decides on the range of output of the second amplifier circuit 318 and makes an adjustment based on the decision. A second adjustment unit 321 makes an adjustment in a similar manner for the output of the second A-D conversion unit 340. A third amplifier circuit 338 amplifies the difference between the output of a sample-and-hold circuit 336 and the output of the second D-A conversion unit 342. At this time, the adjustment by the first adjustment unit 311 is offset by the adjustment by the second adjustment unit 321.

In this second embodiment, too, A-D conversion can be executed in a pipeline manner while maintaining high accuracy. Moreover, A-D conversion can be realized at lower voltage, and power consumption can be reduced. Moreover, the accuracy can be maintained by a structure with a minimal number of elements.

Fourth Embodiment

Figure 17:
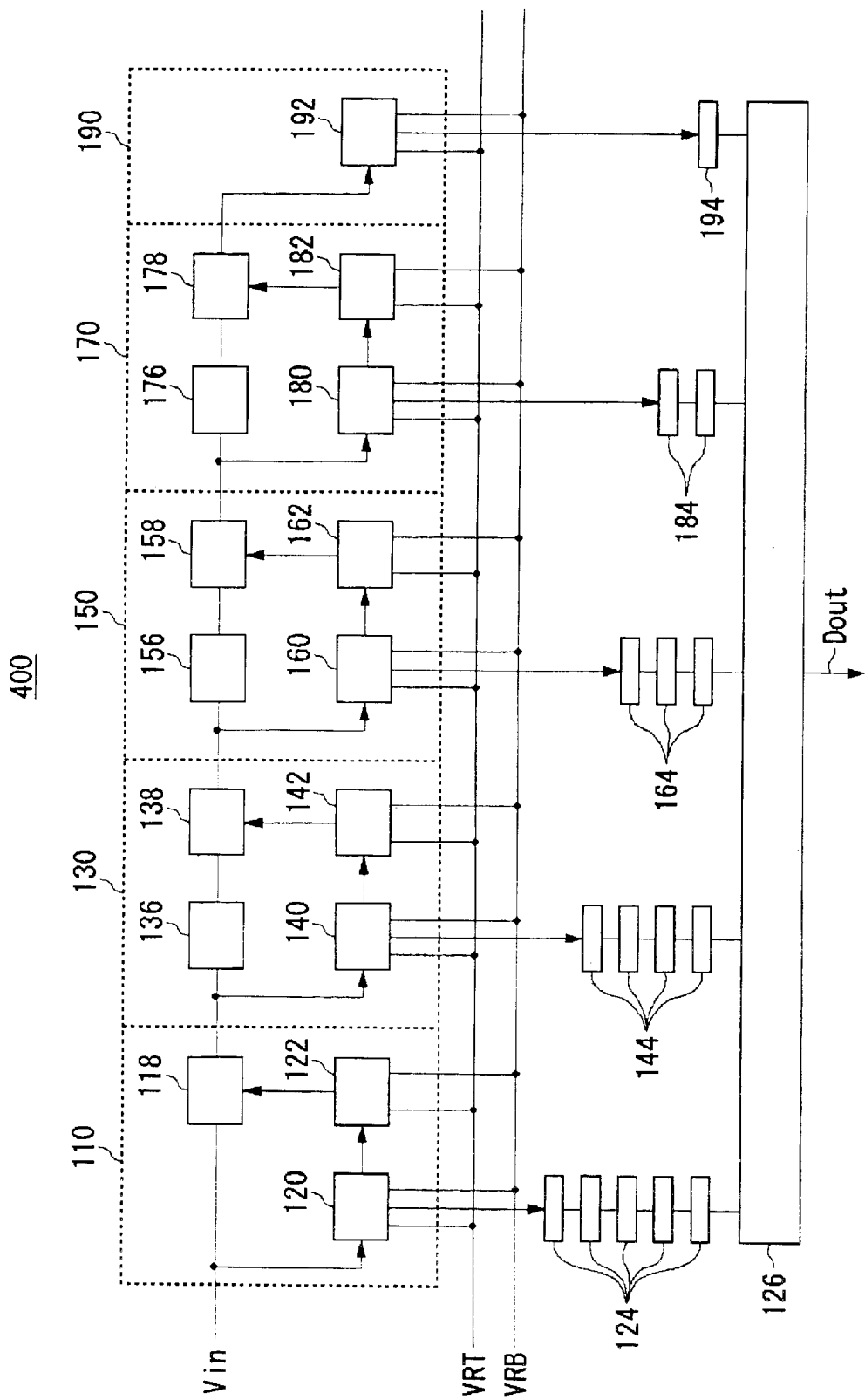
FIG. 17 shows a structure of an analog-digital conversion circuit according to a fourth embodiment of the present invention.

FIG. 17 shows a structure of an analog-digital conversion circuit according to a fourth embodiment of the present invention. The analog-digital conversion circuit 400 according to this fourth embodiment differs from the first to third embodiments in that it is a pipeline type A-D conversion circuit of a five-stage configuration. This circuit carries out a total of 10 bits of A-D conversion in the order of 1 bit, 3 bits, 2 bits, 2 bits and 2 bits at the five stages from a first conversion unit 110 to a fifth conversion unit 190, respectively.

In the first conversion unit 110, a first A-D conversion unit 120 converts an input analog voltage Vin into a 1-bit digital value and sends it to a first latch circuit 124. The digital value is inputted to a digital output circuit 126 after being subjected to a 5-clock delaying by the first latch circuit 124 having the five-stage structure. The output of the first A-D conversion unit 120 is converted into an analog value again by a first D-A conversion unit 122 and then inputted to a first amplifier circuit 118. The first amplifier circuit 118 subtracts the output of the first DA conversion unit 122 from the input analog voltage Vin and sends the difference to a second conversion unit 130, which is the next stage. This series of processings by the first conversion unit 110 is accomplished within one clock. Hence, it is not necessary to sample and hold the input analog voltage Vin, so that the first conversion unit 110 is of a structure that does not include a sample-and-hold circuit.

The second conversion unit 130 to fifth conversion unit 190 are nearly of the same structure as the second conversion unit 30 to the fourth conversion unit 70 of FIG. 1. Even with the above-described structure and arrangement, a relatively large voltage value is subtracted by the first conversion unit 110, so that a voltage value smaller by that reduction is inputted to the amplifier circuits at the second and subsequent stages. This realizes maintenance of conversion performance, operation at lower voltage and reduced power consumption.

The present invention has been described based on the embodiments which are only exemplary. It is understood by those skilled in the art that there exist other various modifications to the combination of each component and process described above and that such modifications are encompassed by the scope of the present invention. Such modified examples will be described hereinbelow.

In the present embodiments, one or two comparators are provided for determining the range of the input analog voltage Vin. As a modified example, there may be provided three or more comparators so as to judge the input analog voltage values in the wider range.

The amplification factor for the sample-and-hold circuit and differential amplifier circuits in the above embodiments can be set in an arbitrary manner, and the structures of the first adjustment circuit 127 and the second adjustment circuit 27 will be determined according to the amplification factor set then.

Although the present invention has been described by way of exemplary embodiments, it should be understood that many changes and substitutions may further be made by those skilled in the art without departing from the scope of the present invention which is defined by the appended claims.

What is claimed is:

1. A signal conversion method, including:
   determining the range of an input signal;
   setting a level of a reference signal according to said determining so that the input signal falls within a satisfactory range in terms of conversion performance thereof;
   holding a signal value obtained as a result of adjustment to the input signal using the reference signal;
   converting the input signal to a target signal in parallel with said holding; and
   offsetting temporary variation caused in the input signal held in said holding.

2. A method according to claim 1, wherein said determining determines whether a voltage value of the input signal is positive or negative.

3. A method according to claim 1, wherein said determining determines whether the input signal falls within a predetermine range or not.

4. A signal conversion circuit, including:
   a first adjustment unit which sets a level of a reference signal according to a range of an input signal so that values of the input signal fall within a satisfactory range in terms of conversion performance thereof;
   a second adjustment unit which cancels temporary variation which is caused in the input signal as a result of setting the reference signal, during conversion of the input signal into a target signal.

5. An analog-to-digital conversion circuit, including:
   a first adjustment unit which sets a level of a reference signal according to a range of an input analog voltage so that values of the input analog voltage fall within a satisfactory range in terms of conversion performance thereof;
   an analog-to-digital (A-D) conversion unit which converts the values of the input analog voltage into digital values; and
   a second adjustment unit which cancels temporary variation which is caused in the values of the input analog voltage during A-D conversion as a result of setting the reference signal.

6. A circuit according to claim 5, wherein said first adjustment unit includes a comparator which determines the range of the input analog voltage, and a sample-and-hold unit which holds a value obtained in a manner such that temporary variation is added to the value of the input analog voltage based on the thus set reference signal so that the values of the input analog voltage fall within the satisfactory range.

7. A circuit according to claim 6, wherein said A-D conversion unit converts the input analog voltage value into a digital value represented by a predetermined bit number, and said second adjustment unit includes: a digital-to-analog (D-A) conversion unit which converts the digital value into an analog value and makes an adjustment to cancel the temporary variation thereof; and a subtracter which subtracts the thus converted analog value from the analog voltage value held at said sample-and-hold unit.

8. A circuit according to claim 5, wherein there are provided plural stages of conversion units at each of which one or more bit digital value are generated gradually starting from a high-order bit, and any of the plural stages of conversion units includes or include said first adjustment unit and said second adjustment unit.

9. A circuit according to claim 6, wherein there are provided plural stages of conversion units at each of which one or more bit digital value are generated gradually starting from a high-order bit, and any of the plural stages of conversion units includes or include said first adjustment unit and said second adjustment unit.

10. A circuit according to claim 7, wherein there are provided plural stages of conversion units at each of which one or more bit digital value are generated gradually starting from a high-order bit, and any of the plural stages of conversion units includes or include said first adjustment unit and said second adjustment unit.

11. A signal conversion circuit for converting analog signals into digital signals, the circuit including:
   analog-to-digital (A-D) conversion unit which acquires an input analog voltage value and then converts the acquired input analog voltage value into a digital value of a predetermined bit number; and a sample-and-hold unit which acquires and holds a value adjusted so that input analog voltage to be acquired by said A-D conversion unit falls within a satisfactory range in terms of conversion performance thereof.

12. A circuit according to claim 4, wherein said first adjustment unit adds artificial variation to input voltage which may cause error to output of a sample-and-hold circuit, on the condition that the added artificial variation is cancelled at a later stage.

13. A circuit according to claim 5, wherein said first adjustment unit adds artificial variation to input voltage which may cause error to output of a sample-and-hold circuit, on the condition that the added artificial variation is cancelled at a later stage.

14. A circuit according to claim 11, wherein the input analog value is inputted, as it is, to said A-D conversion unit and an adjusted value of the input analog value is inputted to said sample-and-hold unit.

15. A circuit according to claim 11, wherein the value to be inputted to said sample-and-hold unit is a value obtained by again converting output from said A-D conversion unit into an analog value and subtracting the thus converted analog value from the original analog value.

* * * * *